(12) United States Patent
Staszewski et al.

(10) Patent No.: US 8,952,763 B2
(45) Date of Patent: Feb. 10, 2015

(54) FREQUENCY MODULATOR HAVING DIGITALLY-CONTROLLED OSCILLATOR WITH MODULATION TUNING AND PHASE-LOCKED LOOP TUNING

(75) Inventors: Robert Bogdan Staszewski, Delft (NL); Chi-Hsueh Wang, Kaohsiung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 93 days.

(21) Appl. No.: 13/612,767

(22) Filed: Sep. 12, 2012

(65) Prior Publication Data

US 2013/0301754 A1 Nov. 14, 2013

Related U.S. Application Data

(60) Provisional application No. 61/645,224, filed on May 10, 2012.

(51) Int. Cl.
*H03C 3/06* (2006.01)
*H04L 27/12* (2006.01)

(52) U.S. Cl.
CPC ..................... *H04L 27/12* (2013.01)
USPC ........... 332/127; 332/128; 375/296; 375/302; 375/376

(58) Field of Classification Search
CPC ............ H04L 7/00; H04L 27/04; H03L 7/099

USPC ............. 331/1 A, 16; 455/260, 264; 332/127, 332/128; 375/376, 302, 296
See application file for complete search history.

(56) References Cited

U.S. PATENT DOCUMENTS

| | | | |
|---|---|---|---|
| 7,532,679 B2 * | 5/2009 | Staszewski et al. | 375/295 |
| 8,045,670 B2 | 10/2011 | Waheed | |
| 8,193,866 B2 * | 6/2012 | Chang | 331/1 A |
| 2007/0189417 A1 * | 8/2007 | Waheed et al. | 375/300 |

OTHER PUBLICATIONS

Staszewski, State-of-the-Art and Future Directions of High-Performance All-Digital Frequency Synthesis in Nanometer CMOS, pp. 229-232, 2010 IEEE.

* cited by examiner

*Primary Examiner* — Arnold Kinkead
(74) *Attorney, Agent, or Firm* — Winston Hsu; Scott Margo

(57) ABSTRACT

A frequency modulator includes a digitally-controlled oscillator (DCO) arranged for producing a frequency deviation in response to a modulation tuning word and a phase-locked loop (PLL) tuning word. In addition, another frequency modulator includes a DCO and a DCO interface circuit. The DCO is arranged for producing a frequency deviation in response to an integer tuning word and a fractional tuning word. The DCO interface circuit is arranged for generating the integer tuning word and the fractional tuning word to the DCO, wherein the fractional tuning word is obtained through asynchronous sampling of a fixed-point tuning word.

21 Claims, 7 Drawing Sheets

FREQUENCY MODULATOR HAVING DIGITALLY-CONTROLLED OSCILLATOR WITH MODULATION TUNING AND PHASE-LOCKED LOOP TUNING

CROSS REFERENCE TO RELATED APPLICATIONS

This application claims the benefit of U.S. provisional application No. 61/645,224, filed on May 10, 2012 and incorporated herein by reference.

BACKGROUND

The disclosed embodiments of the present invention relate to frequency modulation using a digitally-controlled oscillator (DCO), and more particularly, to a frequency modulator having a DCO arranged for receiving a modulation tuning word and a phase-locked loop (PLL) tuning word and/or arranged for receiving a fractional tuning word obtained through asynchronous sampling and an integer tuning word.

All-digital phase-locked loop (ADPLL) based transmitters are becoming increasingly used instead of conventional analog in-phase/quadrature (I/Q) based transmitters. Specifically, an ADPLL can be used to provide not only a single-frequency sinusoidal radio-frequency (RF) carrier but could be turned into a wideband frequency modulator as part, for example, of a polar transmitter. The additional effort to support such a wideband frequency modulation (FM) is quite straightforward and is typically done using a digital two-point modulation scheme. The digital two-point modulation scheme may merge the higher-rate FM sample stream and a lower-rate PLL sample stream, such that one data stream of a higher sampling rate is presented to a DCO. In one conventional design, the merging of two data streams in the digital domain may require an interpolator or a resampler, which increases complexity and power consumption. In addition, the wide modulation bandwidths required by most advanced wireless standards are significantly pushing the limits of the digital polar transmitter. Hence, there is a need to extend the FM bandwidth without the necessity of an excessive complexity and/or power consumption.

If the DCO requires a fine frequency resolution, a digital tuning word generated from a digital FM processing circuit to the DCO is divided into an integer part and a fractional part. A sigma-delta modulation (SDM)-based dithering is employed to process the fractional part according to an oversampling clock. In general, each of the digital FM processing circuit and the SDM circuit operates according to a down-divided clock signal derived from frequency division of a DCO clock. The clock rate of the clock signal used by the SDM circuit is higher than the clock rate of the clock signal employed by the digital FM processing circuit. Unfortunately, a deep clock tree (typically consisting of a tree-like structure of inverters and buffers, some of them having clock gating capability) is required by the digital FM processing circuit due to substantially larger circuitry, and balancing the clock tree delays is difficult. This would result in higher digital circuit cost. Besides, the required synchronicity between the integer part and the fractional part in the digital domain might put unnecessary burden on design time and power consumption.

SUMMARY

In accordance with exemplary embodiments of the present invention, a frequency modulator having a DCO arranged for receiving a modulation tuning word and a PLL tuning word and/or arranged for receiving a fractional tuning word obtained through asynchronous sampling and an integer tuning word is proposed, to solve the above-mentioned problems.

According to a first aspect of the present invention, an exemplary frequency modulator is disclosed. The exemplary frequency modulator includes a digitally-controlled oscillator (DCO) arranged for producing a frequency deviation in response to a modulation tuning word and a phase-locked loop (PLL) tuning word.

According to a second aspect of the present invention, another exemplary frequency modulator is disclosed. The exemplary frequency modulator includes a DCO and a DCO interface circuit. The DCO is arranged for producing a frequency deviation in response to an integer tuning word and a fractional tuning word. The DCO interface circuit is arranged for generating the integer tuning word and the fractional tuning word to the DCO, wherein the fractional tuning word is obtained through asynchronous sampling of a fixed-point tuning word.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
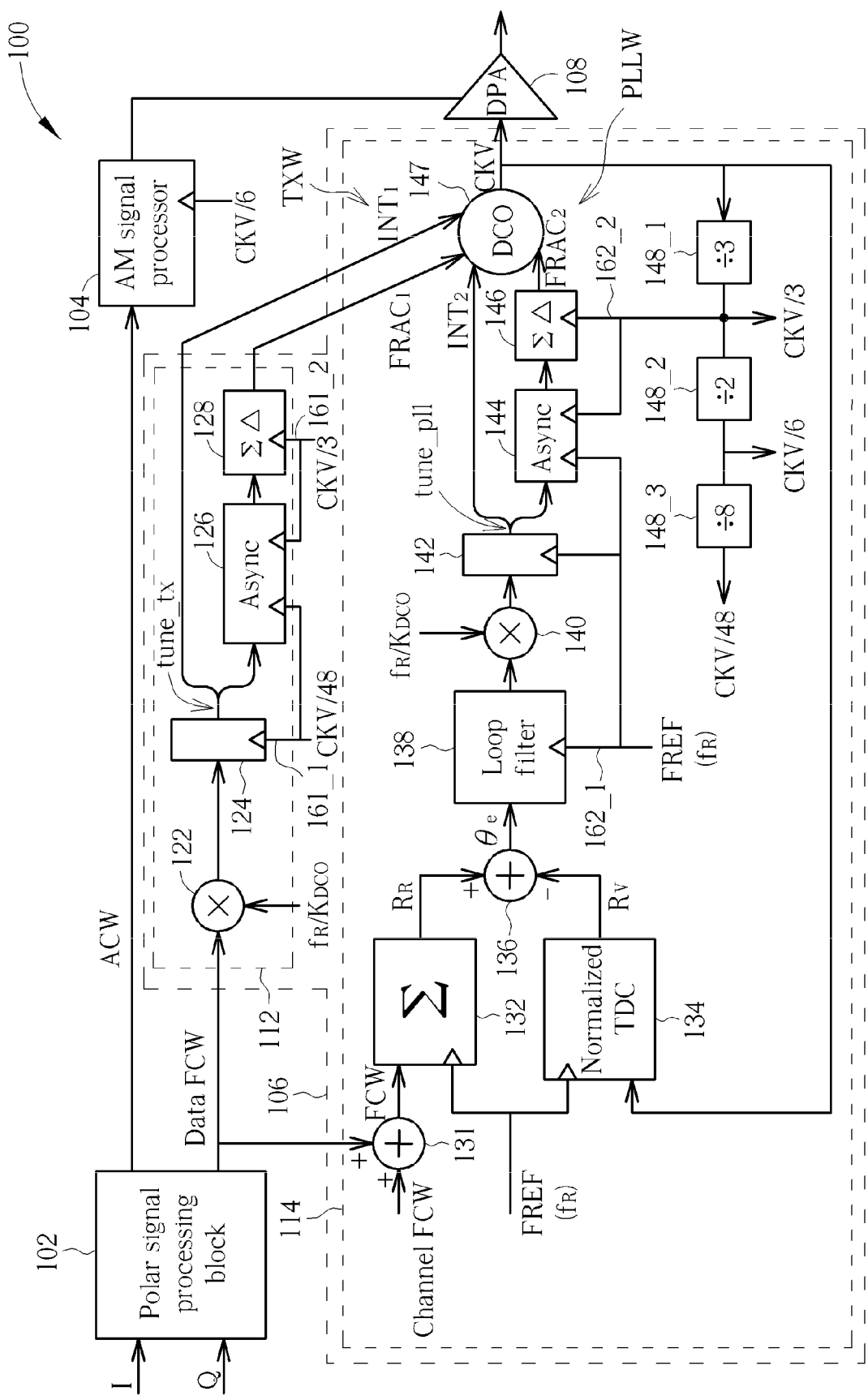
FIG. 1 is a diagram illustrating a polar transmitter according to an exemplary embodiment of the present invention.

FIG. 1 is a diagram illustrating a polar transmitter according to an exemplary embodiment of the present invention. The polar transmitter 100 includes a polar signal processing block 102, an amplitude modulation (AM) signal processor 104 coupled to the polar signal processing block 102, a frequency modulator 106 coupled to the polar signal processing block 102, and a digitally-controlled power amplifier (DPA) 108 coupled to the AM signal processor 104 and the frequency modulator 106. The polar signal processing block 102 is arranged for converting an in-phase component I and a quadrature component Q into an amplitude control word (ACW) and a data frequency control word (FCW), where the ACW is generated in response to an amplitude-modulated (AM) data to be transmitted via the polar transmitter 100, and the data FCW is generated in response to a phase-modulated (PM) data to be transmitted via the polar transmitter 100. By way of example, but not limitation, the polar signal processing block 102 may include a pulse shaping filter, a sampling rate converter (SRC), a coordinate rotation digital computer (CORDIC), etc. The AM signal processor 104 is arranged to refer to the ACW to control the amplitude/power of a transmission (TX) signal generated from the DPA 108. As the present invention focuses on the design of the frequency modulator 106, further description directed to the polar signal processing block 102 and AM signal processor 104 is omitted here for brevity.

The frequency modulator 106 is an ADPLL-based frequency modulator arranged to refer to the data FCW to control the frequency deviation from the carrier of the TX signal generated from the DPA 108. In this embodiment, the frequency modulator 106 includes a TX FM processing circuit 112 disposed in a TX path and an ADPLL 114 disposed in a PLL path, where the TX path is separated from the PLL path. As shown in FIG. 1, the TX FM processing circuit 112 includes a multiplier 122, a sampler (retiming flip-flop register) 124, an asynchronous sampler 126 (denoted by "Async" in FIG. 1), and a sigma-delta modulator 128 (denoted by "ΣΔ" in FIG. 1). Regarding the ADPLL 114, it includes an adder (performing a summation operation) 131, an accumulator 132, a normalized time-to-digital converter (TDC) 134, an adder (performing a subtraction operation) 136, a loop filter 138, a multiplier 140, a sampler (retiming flip-flop register) 142, an asynchronous sampler 144 (denoted by "Async" in FIG. 1), a sigma-delta modulator (denoted by "ΣΔ" in FIG. 1) 146, a DCO 147, and a plurality of frequency dividers 148_1, 148_2, 148_3. The TX FM processing circuit 112 is capable of generating a modulation tuning word TXW to the DCO 147, and the ADPLL 114 is capable of generating a PLL tuning word PLLW to the DCO 147. In this embodiment, the modulation tuning word TXW includes an integer part (i.e., an integer tuning word) $INT_1$ and a fractional part (i.e., a fractional tuning word) $FRAC_1$, and the PLL tuning word PLLW includes an integer part (i.e., an integer tuning word) $INT_2$ and a fractional part (i.e., a fractional tuning word) $FRAC_2$. As can be seen from FIG. 1, the modulation tuning word TXW and the PLL tuning word PLLW are directly fed into the DCO 147. Hence, the DCO 147 is arranged for producing a frequency deviation in response to the received modulation tuning word TXW and the received PLL tuning word PLLW, and accordingly generating a frequency modulated clock CKV.

Figure 2:
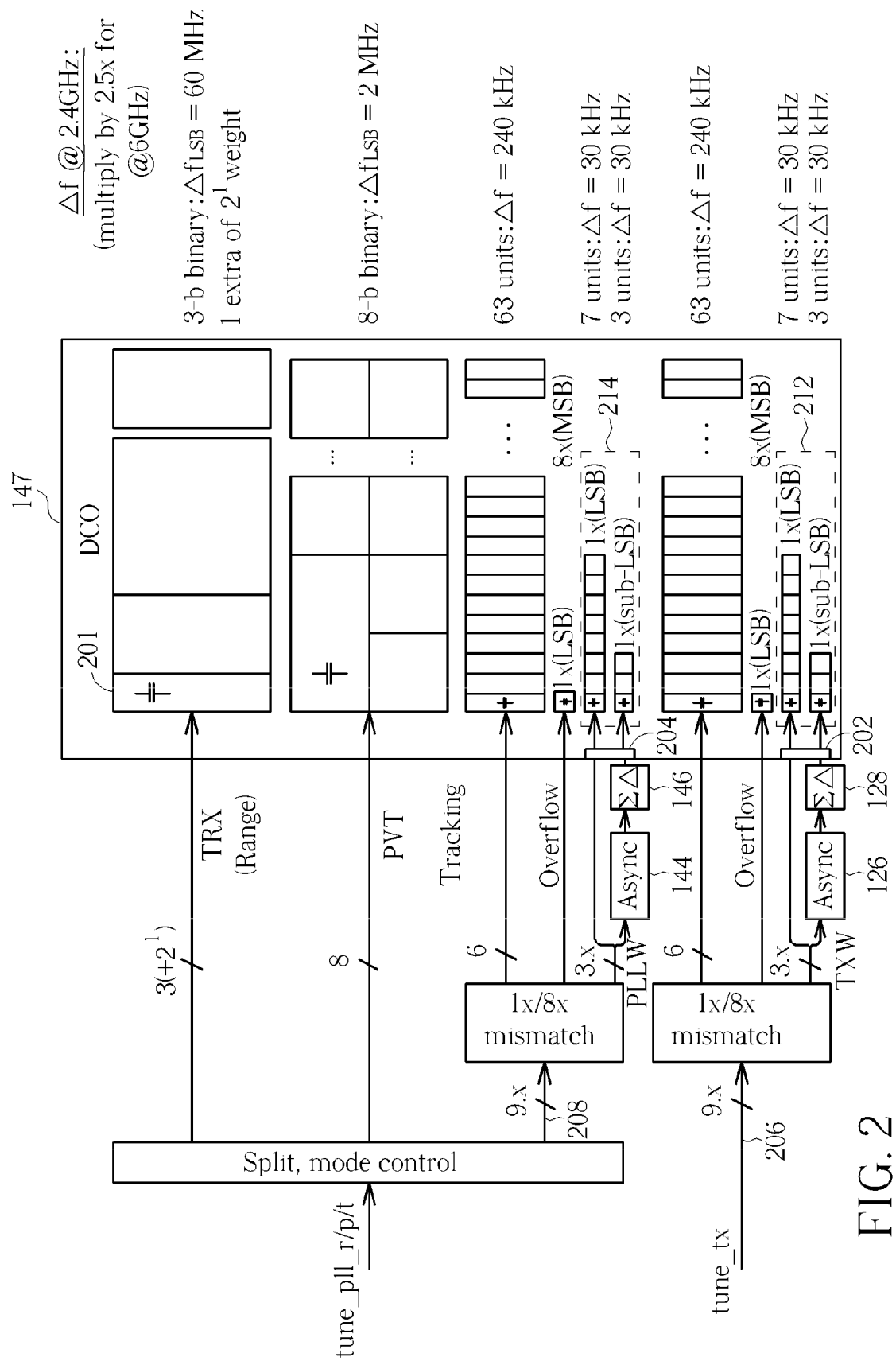
FIG. 2 is a diagram illustrating an exemplary implementation of a digitally-controlled oscillator (DCO) shown in FIG. 1.

FIG. 2 is a diagram illustrating an exemplary implementation of the DCO shown in FIG. 1. The DCO 147 includes varactor banks (e.g., TRX bank, PVT bank, and tracking banks) each having a plurality of varactors 201. In other words, the frequency of the frequency modulated clock CKV generated from the DCO 147 is determined by at least a portion of the varactors 201 controlled by the digital tuning word(s). The DCO 147 has a DCO interface circuit including at least a first tuning port 202 and a second tuning port 204. As shown in FIG. 2, the first tuning port 202 is arranged for receiving/obtaining the modulation tuning word TXW, and the second tuning port 204 is arranged for receiving/obtaining the PLL tuning word PLLW. Hence, the modulating tuning word TXW is distinct from the PLL tuning word PLLW at the DCO interface. Besides, a capacitive value of a first varactor bank 212 implemented in the DCO 147 is set in response to the modulation tuning word TXW, and a capacitive value of a second varactor bank 214 implemented in the DCO 147 is set in response to the PLL tuning word PLLW. In other words, the modulation tuning word TXW and the PLL tuning word PLLW are directly fed into the DCO 147, where the modulation tuning word TXW is transmitted to the DCO 147 via a first path (i.e., the TX path) 206 in a digital domain, the PLL tracking tuning word PLLW is transmitted to the DCO 147 via a second path (i.e., the PLL path) 208 in the digital domain, and the first path 206 and the second path 208 are merged in a capacitive domain of the DCO 147 instead of the digital domain. Hence, the frequency deviation contributions of the modulation tuning word TXW and the PLL tuning word PLLW are asynchronously added in DCO varactor banks in the capacitive domain. In the conventional architecture of the ADPLL with two-point modulation, the digital samples of a direct FM feed and digital samples of a PLL feed are added using a digital logic. However, the present invention proposes performing the addition in a capacitive domain/analog domain of a DCO, thus avoiding the power consumption of the digital synchronization and addition required by the conventional ADPLL. Further, the DCO 147 may be configured to have two identical but separate varactor tracking banks (e.g., 202 and 204). This is beneficial from the layout standpoint since the original single bank typically spans two sides of the large inductor feed. Moreover, as the TX path and the PLL path are not merged in the digital domain, their sampling rates could be entirely independent, i.e., with vastly different rates and asynchronous.

Figure 5:
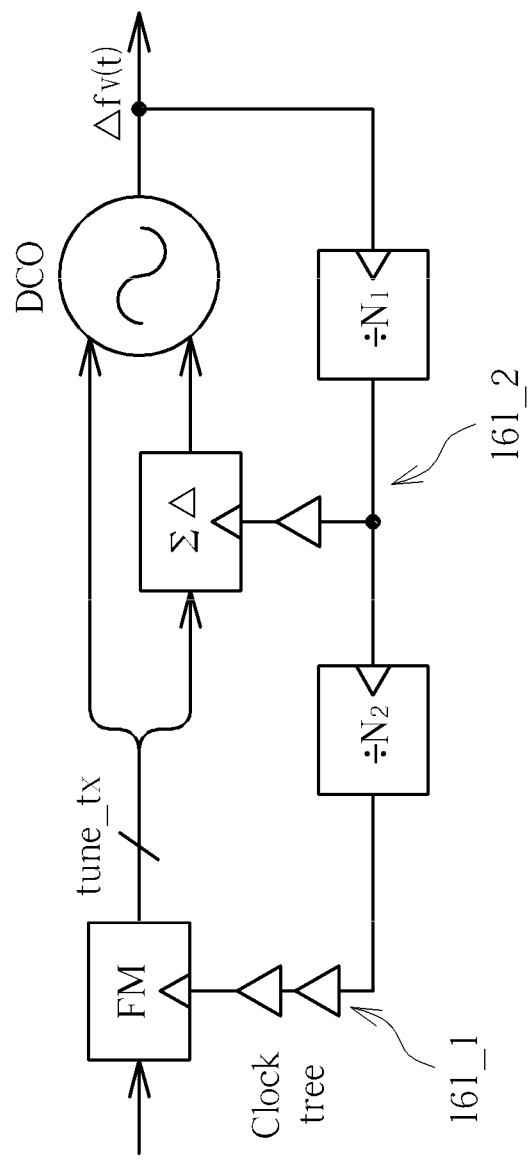
FIG. 5 is a diagram illustrating the relation between two clock trees according to an embodiment of the present invention.

Please refer to FIG. 1 again. The frequency dividers 148_1-148_3 are used to provide different clock signals needed by some elements of the frequency modulator 106 and the polar signal processing block (TX processing block) 102, where the down-divided clocks are synchronous to the frequency modulated clock CKV and have different frequencies. It should be noted that the frequency division factors (e.g., 3, 2, and 8) of the frequency dividers 148_1-148_3 are for illustrative purposes only. That is, the frequency division factors may be adjusted, depending upon the actual clock requirement of clock-driven elements of the frequency modulator 106 and the polar signal processing block 102. In this embodiment, the clock signals are delivered from clock sources to the circuit elements via respective clock distribution trees 161_1, 161_2, 162_1, 162_2. For clarity, FIG. 5 shows two clock distribution trees 161_1 and 161_2 and how they relate to each other. As shown in FIG. 1, a clock frequency of a first clock distribution tree (e.g., 161_1/162_1) is different from a clock frequency in a second clock distribution tree (e.g., 161_2/162_2). By way of example, a propagational delay in the first clock distribution tree (e.g., 161_1/162_1) is substantially different from a propagational delay in the second clock distribution tree (e.g., 161_2/162_2) due to the fact that the integer tuning word and the fractional tuning word are not required to be synchronous to each other. For example, the clock frequency of the first clock distribution tree (e.g., 162_1) is an integer times (or several times) smaller than the clock frequency in the second clock distribution tree (e.g., 162_2). However, this is for illustrative purposes only, and is not meant to be a limitation of the present invention.

Regarding the TX FM processing circuit 112, the data FCW is normalized by the multiplier 122 using a normalizing gain $f_R/K_{DCO}$, and then sampled by the sampler 124 at the sampling rate CKV/48, where $f_R$ is a frequency of a frequency reference clock FREF, and $K_{DCO}$ is an estimated DCO gain. The integer part of the tuning word samples tune_tx directly serves as the integer tuning word $INT_1$ fed into the DCO 147, and the fractional part of the tuning word samples tune_tx will undergo asynchronous sampling performed by the asynchronous sampler 126 and sigma-delta modulation performed by the sigma-delta modulator 128 before entering the DCO 147, where the asynchronous sampler 126 operates according different clock rates CKV/48 and CKV/3, and the sigma-delta modulator 128 operates at the higher clock rate CKV/3. Hence, the FM rate of integer bits is independent from the SDM rate of fractional bits due to asynchronous sampling. The TX FM processing circuit 112 does not require careful timing alignment and proper design of a balanced clock tree distribution, thus mitigating the burden on design time and power consumption.

Regarding the ADPLL 114, the data FCW is added to a frequency FCW (e.g., $f_c/f_R$) at the adder 131, where $f_c$ is a nominal carrier frequency of the frequency modulated clock CKV of the DCO 147. The resultant FCW is accumulated by the accumulator 132 clocked by the frequency reference clock FREF. Therefore, a reference phase $R_R$ is increased by an increment value $f_c/f_R$ each time the accumulator 132 is clocked by one edge of the frequency reference clock FREF. The frequency modulated clock CKV is fed back to the normalized TDC 134 clocked by the frequency reference clock FREF. Therefore, a variable phase $R_V$ is generated each time the normalized TDC 134 is clocked by one edge of the frequency reference clock FREF. A phase error $\theta_e$ between the reference phase $R_R$ and the variable phase $R_V$ is generated from the adder 136 to the loop filter 138. The filtered phase error generated from the loop filter 138 is normalized by the multiplier 140 with a normalizing gain $f_R/K_{DCO}$, and then sampled by the sampler (retiming flip-flop register) 142 at the sampling rate $f_R$. The integer part of the tuning word samples tune_pll directly serves as the integer tuning word $INT_2$ fed into the DCO 147, and the fractional part of the tuning word samples tune_pll will undergo asynchronous sampling performed by the asynchronous sampler 144 and sigma-delta modulation performed by the sigma-delta modulator 146 before entering the DCO 147, where the asynchronous sampler 144 operates according different clock rates $f_R$ and CKV/3, and the sigma-delta modulator 146 operates at the higher clock rate CKV/3. Hence, the FM rate of integer bits is independent from the SDM rate of fractional bits due to asynchronous sampling. Similarly, the ADPLL 114 does not require careful timing alignment and proper design of a balanced clock tree distribution, thus mitigating the burden on design time and power consumption.

Figure 6:
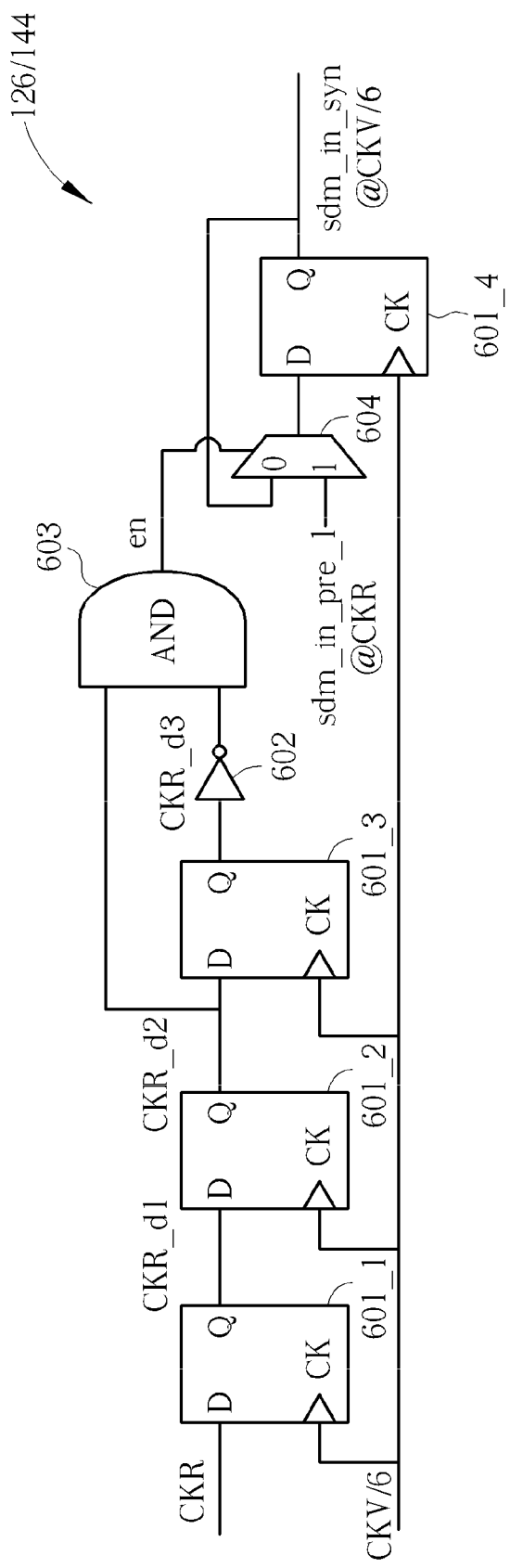
FIG. 6 is a diagram illustrating example implementation of the asynchronous sampler shown in FIG. 1.
Figure 7:
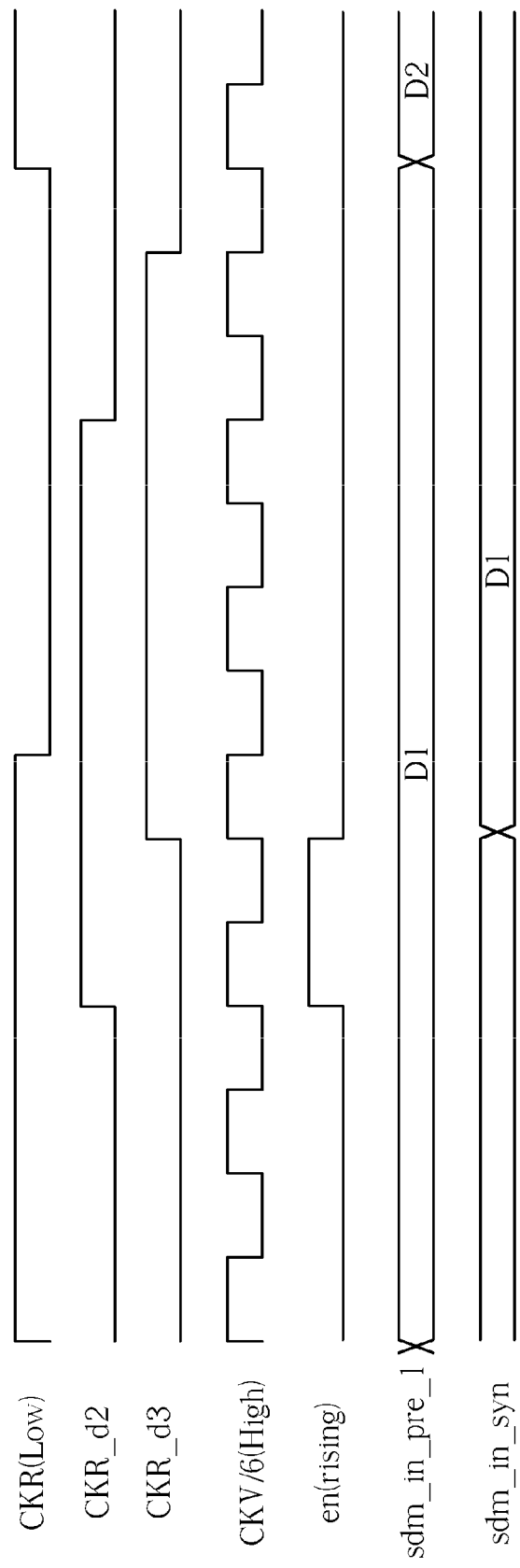
FIG. 7 is a timing diagram illustrating the operation of the asynchronous sampler shown in FIG. 6.

As mentioned above, the desired asynchronous sampling is achieved using the asynchronous sampler 126/144. It should be noted that any means capable of achieving asynchronous sampling may be employed by the asynchronous sampler 126/144. For example, the circuit structure shown in FIG. 6 may be used for realizing the asynchronous sampler 126/144. Please refer to FIG. 6 in conjunction with FIG. 7. FIG. 6 is a diagram illustrating example implementation of the asynchronous sampler 126/144 shown in FIG. 1, and FIG. 7 is a timing diagram illustrating the operation of the asynchronous sampler 126/144 shown in FIG. 6. In this embodiment, the asynchronous sampler 126/144 includes a plurality of D-type flip-flops 601_1, 601_2, 601_3 and 601_4, an inverter 602, an AND gate 603 and a selector 604, where a retimed frequency reference clock CKR may be generated by using rising edges of the frequency modulated clock CKV to sample the frequency reference clock FREF, each D-type flip-flop is triggered by CKV/6, and the selector 604 is controlled by a logic output of the AND gate 603. Please note that the number of D-type flip-flops and the clock rates shown in FIG. 6 are for illustrative purposes only. The clock signal CKR could be FREF or CKV/48 in FIG. 1, and the clock signal CKV/6 could be CKV/6 in FIG. 1. As a person skilled in the art can readily understand details of the exemplary asynchronous sampler shown in FIG. 6 by referring to the timing diagram shown in FIG. 7, further description is omitted for brevity.

As shown in FIG. 1, the sampler 124 in the TX path is clocked by CKV/48, while the sampler 142 in the PLL path is clocked by FREF; besides, the asynchronous sampler 126 in the TX path operates according to clock rates CKV/48 and CKV/3, while the asynchronous sampler 126 in the PLL path operates according to clock rates $f_R$ and CKV/3. Therefore, as can be readily known from FIG. 1, the sampling rate of the modulating tuning word TXW is dependent on the frequency deviation due to the sampling clock, which is a down-divided clock derived from the frequency modulated clock CKV. Samples of the modulating tuning word TXW and the PLL tuning word PLLW are asynchronous, and the sampling rate of the modulating tuning word TXW is different from sampling rate of the PLL tuning word PLLW. By way of example, a ratio of the sampling rate of the modulating tuning word TXW and the sampling rate of the PLL tuning word PLLW is not an integer.

Moreover, samples of a fractional tuning word (e.g., $FRAC_1$ or $FRAC_2$) may be synchronous to the resonant frequency of the DCO 147 due to the down-divided clocks CKV/48 and CKV/3 derived from the frequency modulated clock CKV, samples of an integer tuning word (e.g., $INT_2$) may be asynchronous to the resonant frequency of the DCO 147 due to the independent and fixed frequency reference clock FREF, and a ratio of sampling rate of an integer tuning word (e.g., $INT_2$) and sampling rate of a fractional tuning word (e.g., $FRAC_2$) may not be an integer due to the frequency discrepancy between FREF and CKV/3. Further, regarding each of the modulation tuning word TXW and the PLL tuning word PLLW, samples of the integer tuning word $INT_1/INT_2$ and the fractional tuning word $FRAC_1/FRAC_2$ are asynchronous due to the asynchronous sampler 126/144.

Figure 3:
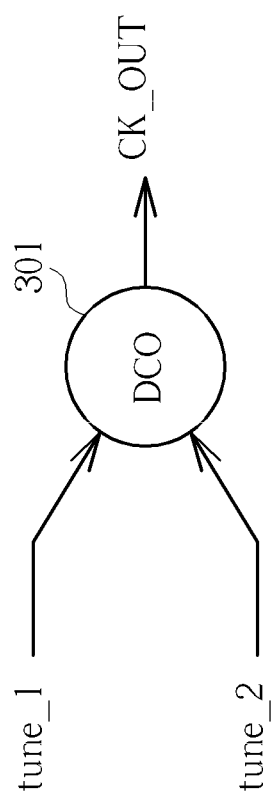
FIG. 3 is a diagram illustrating one generalized DCO design according to an embodiment of the present invention.
Figure 4:
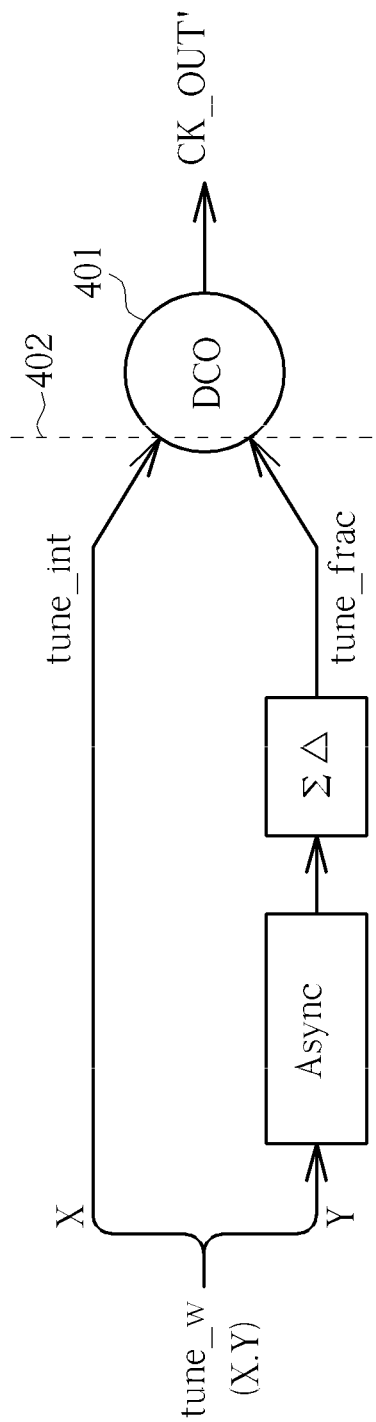
FIG. 4 is a diagram illustrating another generalized DCO design according to an embodiment of the present invention.

In the exemplary embodiment shown in FIG. 1, the DCO 147 directly receives two separate tuning words (i.e., one integer tuning word and one fractional tuning word) rather than receiving a tuning word derived from combining these two separate tuning words, and the fractional tuning word of each tuning word received via an interface of the DCO is obtained through asynchronous sampling. However, this is for illustrative purposes only, and is not meant to be a limitation of the present invention. Please refer to FIG. 3 and FIG. 4. FIG. 3 is a diagram illustrating one generalized DCO design according to an embodiment of the present invention. FIG. 4 is a diagram illustrating another generalized DCO design according to an embodiment of the present invention. As shown in FIG. 3, no matter how a modulation tuning word tune_1 and a phase-locked loop tuning word tune_2 are generated, a DCO 301 configured for producing a frequency deviation in a DCO clock (e.g., a frequency modulated clock) CK_OUT in response to the received modulation tuning word tune_1 and phase-locked loop tuning word tune_2 falls within the scope of the present invention. As shown in FIG. 4, no matter how many tuning words a DCO 401 receives, the DCO 401 configured for producing a frequency deviation in a DCO clock (e.g., a frequency modulated clock) CK_OUT' in response to an integer tuning word tune_int (i.e., an integer part X of a fixed-point tuning word tune_w) and a fractional tuning word tune_frac obtained through asynchronous sampling of a fixed-point tuning word (i.e., a fractional part Y of the tuning word tune_w) falls within the scope of the present invention. Specifically, the DCO 401 receives the integer tuning word tune_int and the fractional tuning word tune_frac through an asynchronous interface 402.

Regarding the polar transmitter 100 shown in FIG. 1, the modulation bandwidth handling capacity may be greatly improved due to the frequency modulator 106 using the proposed DCO design. It should be noted that employing the proposed DCO in an ADPLL of a polar transmitter is merely one embodiment of the present invention. In practice, any application using the proposed DCO 147/301/401 falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency modulator comprising:
    a digitally-controlled oscillator (DCO), arranged for producing a frequency deviation in response to a modulation tuning word and a phase-locked loop (PLL) tuning word,
    wherein said PLL tuning word comprises an integer part and a fractional part, and at least one of said integer part and said fractional part is obtained through asynchronous samplings;
    wherein said modulation tuning word comprises an integer part and a fractional part, and said fractional part of said modulation tuning word is obtained through asynchronous sampling.

2. The frequency modulator of claim 1, wherein said modulating tuning word is distinct from said PLL tuning word at an interface of said DCO.

3. The frequency modulator of claim 1, wherein said DCO has a first tuning port and a second tuning port, said first tuning port is arranged for receiving said modulation tuning word, and said second tuning port is arranged for receiving said PLL tuning word.

4. The frequency modulator of claim 1, wherein said modulation tuning word is transmitted to said DCO via a first path in a digital domain, said PLL tuning word is transmitted to said DCO via a second path in said digital domain, and said first path and said second path are not merged in said digital domain.

5. The frequency modulator of claim 1, wherein said modulation tuning word is transmitted to said DCO via a first path, said PLL tuning word is transmitted to said DCO via a second path, and said first path and said second path are merged in a capacitive domain of said DCO.

6. The frequency modulator of claim 1, wherein said DCO comprises a plurality of separate varactor banks including at least a first varactor bank and a second varactor bank, a capacitive value of said first varactor bank is set in response to said modulation tuning word, and a capacitive value of said second varactor bank is set in response to said PLL tuning word.

7. The frequency modulator of claim 1, wherein said DCO is part of an all-digital PLL (ADPLL).

8. The frequency modulator of claim 1, wherein said modulation tuning word is generated in response to a phase-modulated (PM) data of a polar transmitter.

9. A frequency modulator comprising:
    a digitally-controlled oscillator (DCO), arranged for producing a frequency deviation in response to an integer tuning word and a fractional tuning word; and
    a DCO interface circuit, arranged for generating said integer tuning word and said fractional tuning word to said DCO, wherein said fractional tuning word is obtained through asynchronous sampling of a fixed-point tuning word;
    wherein samples of said fractional tuning word are synchronous to a resonant frequency of said DCO.

10. A frequency modulator comprising:
    a digitally-controlled oscillator (DCO), arranged for producing a frequency deviation in response to an integer tuning word and a fractional tuning word; and
    a DCO interface circuit, arranged for generating said integer tuning word and said fractional tuning word to said DCO, wherein said fractional tuning word is obtained through asynchronous sampling of a fixed-point tuning word;
    wherein samples of said integer tuning word are asynchronous to a resonant frequency of said DCO.

11. The frequency modulator of claim 9, wherein samples of said integer tuning word and said fractional tuning word are asynchronous.

12. The frequency modulator of claim 9, wherein ratio of a sampling rate of said integer tuning word and a sampling rate of said fractional tuning word is not an integer.

13. The frequency modulator of claim 9, wherein said DCO produces said frequency deviation in response to a modulation tuning word and a phase-locked loop (PLL) tuning word, and said modulation tuning word is composed of said integer tuning word and said fractional tuning word.

14. The frequency modulator of claim 13, wherein said modulation tuning word is generated in response to a phase-modulated (PM) data of a polar transmitter.

15. The frequency modulator of claim 9, wherein said DCO produces said frequency deviation in response to a modulation tuning word and a phase-locked loop (PLL) tuning word, and said PLL tuning word is composed of said integer tuning word and said fractional tuning word.

16. The frequency modulator of claim 15, wherein said modulation tuning word is generated in response to a phase-modulated (PM) data of a polar transmitter.

17. The frequency modulator of claim 9, wherein said DCO is part of an all-digital PLL (ADPLL).

18. The frequency modulator of claim 9, further comprising a first and second clock distribution trees.

19. A frequency modulator comprising:
    a digitally-controlled oscillator (DCO), arranged for producing a frequency deviation in response to an integer tuning word and a fractional tuning word;
    a DCO interface circuit, arranged for generating said integer tuning word and said fractional tuning word to said DCO, wherein said fractional tuning word is obtained through asynchronous sampling of a fixed-point tuning word; and
    a first and second clock distribution trees;
    wherein a propagational delay in said first clock distribution tree is substantially different from a propagational delay in said second clock distribution tree.

20. The frequency modulator of claim 18, wherein a clock frequency of said first clock distribution tree is different from a clock frequency in said second clock distribution tree.

21. The frequency modulator of claim 18, wherein a clock frequency of said first clock distribution tree is an integer times smaller than a clock frequency in said second clock distribution tree.

* * * * *